United States Patent
Yano et al.

(10) Patent No.: US 7,723,839 B2
(45) Date of Patent: May 25, 2010

(54) SEMICONDUCTOR DEVICE, STACKED SEMICONDUCTOR DEVICE, AND MANUFACTURING METHOD FOR SEMICONDUCTOR DEVICE

(75) Inventors: Yuji Yano, Tenri (JP); Seiji Ishihara, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 511 days.

(21) Appl. No.: 11/446,189

(22) Filed: Jun. 5, 2006

(65) Prior Publication Data
US 2006/0278970 A1    Dec. 14, 2006

(30) Foreign Application Priority Data
Jun. 10, 2005    (JP) .............................. 2005-171730

(51) Int. Cl.
*H01L 23/12* (2006.01)

(52) U.S. Cl. ..................... 257/700; 257/678; 257/684; 257/690; 257/686; 257/737; 257/738; 257/748; 257/777; 257/780; 257/782; 257/713; 257/E21.499; 257/E21.519; 257/E33.001; 257/E23.194

(58) Field of Classification Search ................. 257/678, 257/684, 686, 690, 707, 713, 734, 737, 738, 257/778, 780, 782, E21.499, E21.519, E33.001, 257/E23.194, 700
See application file for complete search history.

(56) References Cited

U.S. PATENT DOCUMENTS

| | | | | |
|---|---|---|---|---|
| 5,831,441 | A * | 11/1998 | Motooka et al. ............. | 324/754 |
| 6,105,245 | A | 8/2000 | Furukawa | |
| 6,603,198 | B2 * | 8/2003 | Akram et al. ................ | 257/686 |
| 6,680,529 | B2 * | 1/2004 | Chen et al. ................... | 257/700 |
| 6,740,546 | B2 * | 5/2004 | Corisis et al. ............... | 438/126 |
| 6,750,547 | B2 * | 6/2004 | Jeung et al. .................. | 257/778 |
| 6,853,078 | B2 * | 2/2005 | Yamaya et al. .............. | 257/750 |
| 6,956,296 | B2 * | 10/2005 | Boyaud et al. .............. | 257/787 |
| 7,230,329 | B2 * | 6/2007 | Sawamoto et al. .......... | 257/686 |
| 7,372,151 | B1 * | 5/2008 | Fan et al. ..................... | 257/738 |
| 2001/0020739 | A1 | 9/2001 | Honda | |
| 2002/0064935 | A1 | 5/2002 | Honda | |
| 2002/0121689 | A1 | 9/2002 | Honda | |
| 2003/0133274 | A1 * | 7/2003 | Chen et al. ................... | 361/760 |
| 2003/0137045 | A1 | 7/2003 | Sugaya et al. | |

(Continued)

FOREIGN PATENT DOCUMENTS

CN    2558078 Y    6/2003

(Continued)

*Primary Examiner*—Wai-Sing Louie
*Assistant Examiner*—Marc Armand
(74) *Attorney, Agent, or Firm*—Nixon & Vanderhye, PC

(57) ABSTRACT

A semiconductor device includes: a base substrate; a semiconductor chip formed on the base substrate in such a manner that an adhesive layer is interposed between the semiconductor chip and the base substrate; a resin layer covering at least a portion of the semiconductor chip; and an external connection terminal electrically connected to the base substrate via a wiring layer. The external connection terminal is in the same plane as the surface of the resin layer, and is exposed from the resin layer. With this configuration, it is possible to provide a semiconductor device of a lower stage, and a stacked semiconductor device, each of which is high in connection reliability in a case of stacking plural semiconductor devices, no matter if a connection terminal of a semiconductor device stacked on an upper stage is low.

11 Claims, 9 Drawing Sheets

U.S. PATENT DOCUMENTS

| | | |
|---|---|---|
| 2004/0145044 A1 | 7/2004 | Sugaya et al. |
| 2004/0164411 A1* | 8/2004 | Shin et al. .................. 257/734 |
| 2005/0008525 A1 | 1/2005 | Pfarr et al. |
| 2005/0012195 A1 | 1/2005 | Go et al. |
| 2005/0040529 A1 | 2/2005 | Lee |

FOREIGN PATENT DOCUMENTS

| | | |
|---|---|---|
| CN | 1449232 A | 10/2003 |
| JP | 6-291221 A | 10/1994 |
| JP | 8-236665 A | 9/1996 |
| JP | 9-330992 A | 12/1997 |
| JP | 10-135267 | 5/1998 |
| JP | 10-289923 A | 10/1998 |
| JP | 11-186492 | 7/1999 |
| JP | 2001-298115 | 10/2001 |
| JP | 2002-359350 A | 12/2002 |
| JP | 2004-172157 | 6/2004 |
| JP | 2004-319892 | 11/2004 |
| JP | 2005-72587 A | 3/2005 |
| KR | 2001-0070217 A | 7/2001 |
| KR | 2001-0089209 A | 9/2001 |

* cited by examiner

US 7,723,839 B2

SEMICONDUCTOR DEVICE, STACKED SEMICONDUCTOR DEVICE, AND MANUFACTURING METHOD FOR SEMICONDUCTOR DEVICE

This Nonprovisional application claims priority under 35 U.S.C. §119(a) on Patent Application No. 171730/2005 filed in Japan on Jun. 10, 2005, the entire contents of which are hereby incorporated by reference.

FIELD OF THE TECHNOLOGY

The present application discloses technology relating to: (i) a semiconductor device having thereon a semiconductor chip; (ii) a stacked semiconductor device in which a plurality of semiconductor devices are stacked; and (iii) a manufacturing method for a semiconductor device.

BACKGROUND OF THE TECHNOLOGY

Smaller and lighter electronic devices having more advanced functions have been developed. Under such circumstances, it is required that semiconductor devices be more densely packaged. In response to such a requirement, for example, Japanese Unexamined Patent Publications No. 135267/1998 (Tokukaihei 10-135267; published on May 22, 1998) and No. 172157/2004 (Tokukai 2004-172157; Published on Jun. 17, 2004) suggest a method which allows higher density packaging of semiconductor devices by stacking the semiconductor devices.

Incidentally, in stacking of the semiconductor devices having a conventional configuration, a relationship between (i) a height of a connecting terminal of an upper semiconductor device and (ii) a height of sealing resin of a lower semiconductor device is important.

The following describes about this point, with reference to FIG. 15 to FIG. 17. FIG. 15 is a cross sectional view illustrating a stack of two conventional semiconductor devices.

In FIG. 15, a semiconductor device 200 is stacked on a semiconductor device 100. Of the two semiconductor devices, the semiconductor device 100 includes: a base substrate 101; a semiconductor chip 103 mounted on the base substrate 101; external connection terminals 107 provided on a bottom surface of the base substrate 101; and external connection terminals 108 provided on an upper surface of the base substrate 101. The semiconductor chip 103 and the base substrate 101 are electrically connected with each other via a wire 104. Further, the semiconductor chip 103 and the wire 104 are covered with a resin layer 106. On the other hand, a region, of the base substrate 101, where the external connection terminals 108 are provided is not covered by the resin layer 106, and is exposed.

The semiconductor device 200 has the same configuration as that of the semiconductor device 100, except in that a resin layer 106 covers the entire region above a base substrate 101, instead of covering regions other than a region where a semiconductor chip 103 and a wiring 104 are formed.

For example, the following problems may take place in a case where the two semiconductor devices 100 and 200 are stacked as illustrated in FIG. 15. Namely, if a height "s" of each of the external connection terminals 107 of the semiconductor device 200 is lower than a height "t" of the resin layer 106 of the semiconductor device 100, there will be a gap "u" between the external connection terminal 107 of the semiconductor device 200 and one of the external connection terminals 108 of the semiconductor device 100. Due to this gap "u", it is unable to connect the semiconductor device 100 with the semiconductor device 200. Accordingly, in order to connect the semiconductor device 100 and the semiconductor device 200, it is necessary to satisfy the relationship of "s">"t", where "s" is the height of the external connection terminal 107 of the semiconductor device 200, and the "t" is the height of the resin layer 106 of the semiconductor device 100.

If the height "t" of the external connection terminal 107 of the semiconductor device 200 is reduced, the height "t" of the resin layer 106 of the semiconductor device 100 also has to be reduced. However, reduction of the high "t" of the resin layer 106 of the semiconductor device 100 requires a technology for reducing the thickness of the semiconductor device 100: e.g., a technology for reducing the thickness of the semiconductor chip 103, or a technology for lowering the height of the loop formed by the wiring 104. This causes technical difficulty in the production of the semiconductor device 100. A similar problem occurs in a case of stacking semiconductor devices illustrated in FIG. 16.

FIG. 16 is a cross sectional view illustrating a stack of two conventional semiconductor devices. In FIG. 16, a semiconductor device 400 is stacked on the semiconductor device 300. The semiconductor device 300 has an external connection terminal 108 formed on a semiconductor chip 103. A region where the external connection terminal 108 is formed is not covered by a resin layer 106, and the region therefore is exposed. Other than what mentioned above, the configuration of the semiconductor device 300 is the same as that of the foregoing semiconductor device 100. Further, the configuration of the semiconductor device 400 is similar to that of the foregoing semiconductor device 200.

FIG. 17 is a cross sectional view illustrating a resin-sealing process carried out in a manufacturing process of a conventional semiconductor device. In manufacturing of the above mentioned semiconductor device 300, the following problem occurs in the resin-sealing process. Namely, for example, if a transfer mold is used for carrying out the resin-sealing process for covering, with a resin 106, the semiconductor chip 103 except for the region where the external connection terminal 108 is formed, a mold 50 directly presses the wiring layer 108 on the semiconductor chip 103, which layer includes conductive layer x and an insulation layer y (See FIG. 17). The thickness of the wiring layer 108 is approximately 50 μm and is thin. Further, the material of the wiring layer 108 is hardly deformed. As such, the wiring layer 108 will not be able to absorb the stress applied by the mold 50. As a result, a strong stress is applied to the semiconductor chip 103, and this strong stress may cause damage to the semiconductor chip 103.

SUMMARY OF THE TECHNOLOGY

In view of the foregoing problems, the technology was made, and it is one of objects of the present technology to contribute to realization of higher density packaging of semiconductor devices, by providing a semiconductor device of a lower stage, and a stacked semiconductor device, each of which is high in connection reliability in a case of stacking plural semiconductor devices, no matter if a connection terminal of a semiconductor device stacked on an upper stage is low.

Further, it reduces, through a simple process, damage to a semiconductor chip or the like in such a configuration that an external connection terminal is exposed from a resin layer.

In order to achieve the objects, the semiconductor device includes: a base substrate; a semiconductor chip electrically connected to the base substrate; a resin layer covering at least a portion of the semiconductor chip; and a first external connection terminal electrically connected to the base substrate, wherein the first external connection terminal has an exposed surface which is exposed from a surface of the resin layer, and the exposed surface of the first external connection terminal and the surface of the resin layer form a single plane.

In the configuration, the first external connection terminal has the exposed surface which is exposed from the surface of the resin layer, and the exposed surface of the first external connection terminal and the surface of the resin layer form a single plane. Therefore, at a time of stacking another semiconductor device on the semiconductor device of the present technology, the first external connection terminal is connected with an external connection terminal of the upper semiconductor device, even if the external connection terminal of the upper semiconductor device is low. Incidentally, in a case where external connection terminals of the upper semiconductor device are arranged at a narrow pitch, the height of each of the external connection terminals is low. However, with the configuration, the resin layer does not block the external connection terminal from reaching the first external connection terminal. Thus, it is not necessary to lower the resin layer for the purpose of acquiring a connection between the external connection terminals. As a result, the semiconductor device is high in its connection reliability, and is easily manufactured without a need for a technology to reduce the thickness of the semiconductor device, such a technology being a technology for reducing the thickness of the semiconductor chip, a technology for lowering the loop of the wire, or the like.

Further, instead of exposing the wiring layer formed on the semiconductor chip, the above described first external connection terminal is used for acquiring the connection with the upper semiconductor device. This reduces damage to the semiconductor chip even if the semiconductor device is sealed with a resin by using a transfer mold or the like.

In order to achieve the objects, a method for manufacturing a semiconductor device is a method for manufacturing a semiconductor device including (i) a base substrate, (ii) a semiconductor chip electrically connected to the base substrate, (iii) a resin layer covering at least a portion of the semiconductor chip, and (iv) a first external connection terminal electrically connected to the base substrate, the method comprising the step of: (A) sealing with a resin such that (a) the first external connection terminal has an exposed surface which is exposed from a surface of the resin layer, and (b) the exposed surface of the first external connection terminal and the surface of the resin layer form a single plane.

With the configuration, it is possible to manufacture a semiconductor device in which (i) a first external connection terminal having the exposed surface which is exposed from a surface of the resin layer, and (ii) the exposed surface and the surface of the resin layer form a single plane. Thus, at a time of stacking another semiconductor device on the semiconductor device, the semiconductor devices are connected with each other, even if an external connection terminal of the upper semiconductor device is low. Incidentally, in a case where external connection terminals of the upper semiconductor device are arranged at a narrow pitch, the height of each of the external connection terminals is low. However, with the configuration, the resin layer does not block the external connection terminal from reaching the first external connection terminal. Thus, with this manufacturing method, it is not necessary to lower the resin layer for the purpose of acquiring a connection with the upper semiconductor device. As a result, the method allows easy manufacturing of a semiconductor device which is high in its connection reliability, and the method does not require a technology to reduce the thickness of the semiconductor device, such a technology being a technology for reducing the thickness of the semiconductor chip, a technology for lowering the loop of the wire, or the like.

Further, damage to the semiconductor chip is reduced by (i) forming and deforming the external connection terminal, and then (ii) carrying out the resin-sealing process, instead of exposing the wiring layer formed on the surface of the semiconductor chip for the purpose of acquiring the connection with the upper semiconductor device.

Further, in order to achieve the objects, the method may be so adapted that the step (A) includes the sub steps of: pressing a mold against the first external connection terminal to flatten a surface of the first external connection terminal; and sealing with the resin such that (a) the first external connection terminal has the exposed surface which is exposed from the surface of the resin layer, and (b) the exposed surface of the first external connection terminal and the surface of the resin layer form a single plane.

In the configuration, the sub step of sealing is carried out after the external connection terminal is deformed by pressing the mold against the external connection terminal. With this simple process, it is possible to expose, from the resin layer, the exposed surface of the external connection terminal, and to form a single plane including the exposed surface and the surface of the resin layer. Thus, a semiconductor device is easily manufactured.

Additional objects, features, and strengths of the present technology will be made clear by the description below. Further, the advantages will be evident from the following explanation in reference to the drawings.

BRIEF DESCRIPTION OF THE DRAWINGS

FIG. 3($b$) is a cross sectional view illustrating a semiconductor device manufacturing process of an embodiment.

FIG. 3($c$) is a cross sectional view illustrating a semiconductor device manufacturing process of an embodiment.

DESCRIPTION OF THE EMBODIMENTS

The following describes an embodiment with reference to FIG. 1 through FIG. 14. Note that the following explanation contains expressions such as "upper surface", "lower surface", "above", and "below", each of which is based on top and bottom of the drawings. However, these expressions are used for the sake of simple explanation, and are not meant to limit which one of surfaces faces upward (or downward).

Figure 1:
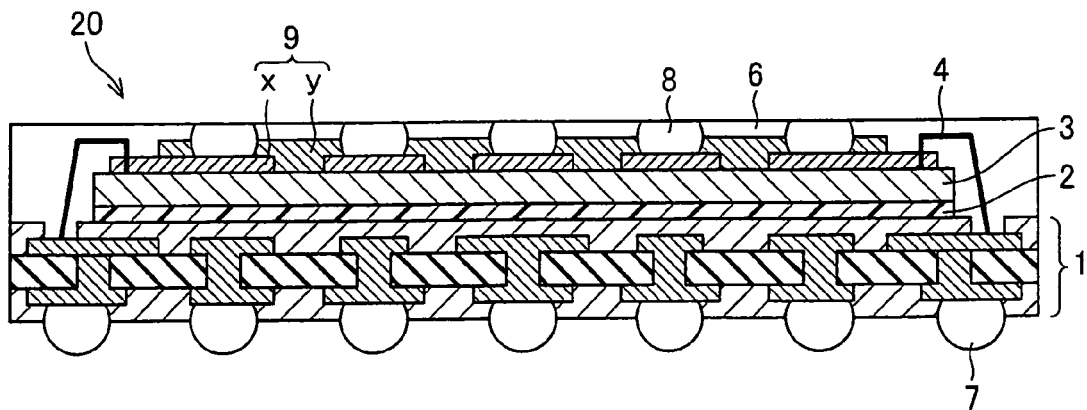
FIG. 1 is a cross sectional view illustrating a configuration of a semiconductor device of an embodiment.
Figure 2:
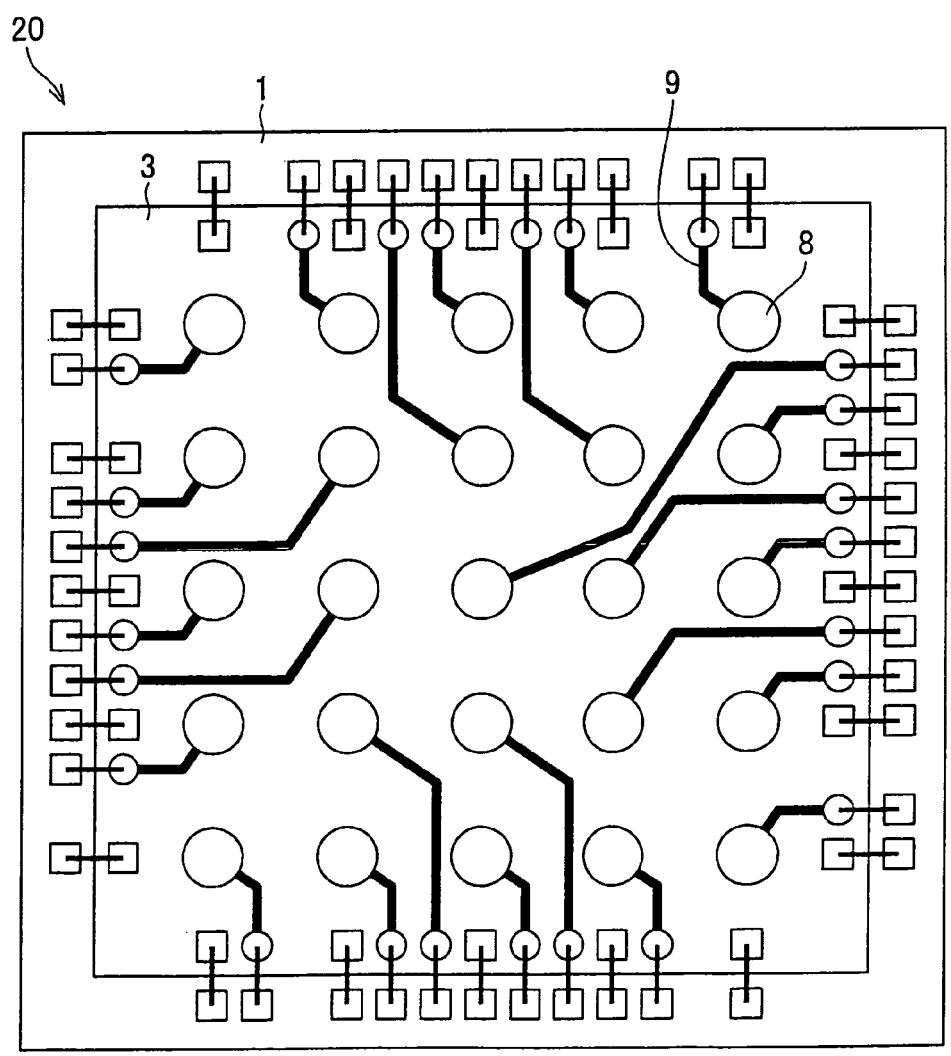
FIG. 2 is a plane view illustrating the semiconductor device of FIG. 1 viewed from above.

FIG. 1 is a cross sectional view illustrating a configuration of a semiconductor device. FIG. 2 is a plane view illustrating the semiconductor device of FIG. 1 which is viewed from above.

As illustrated in FIG. 1, a semiconductor device 20 of the present embodiment includes: a base substrate 1; a semiconductor chip 3 mounted on an adhesive layer 2 on the base substrate 1; and external connection terminals (second external connection terminals) 7 provided on the bottom surface of the base substrate 1. The base substrate 1 and the semiconductor chip 3 are electrically connected with each other via a wire 4.

On the upper surface of the semiconductor chip 3, a wiring layer 9 is formed, and external connection terminals (first external connection terminals) 8 which are electrically conductive projections formed on the wiring layer 9. As illustrated in FIG. 2, these external connection terminals 8 are arranged in an area-array manner. Further, The wiring layer 9 and the base substrate 1 are connected with each other via the wire 4.

Further, the semiconductor device 20 is sealed by a resin layer 6. More specifically, the resin layer 6 covers: the upper surface of the base substrate 1, the adhesive layer 2, the semiconductor chip 3, the wire 4, and the wiring layer 9. For example, a suitable material of the resin layer 6 may be: epoxy resin, silicone resin, or the like. However, the material of the resin layer 6 is not particularly limited.

A characteristic of the semiconductor device 20 of the present embodiment is that each of the external connection terminals 8 is in the same plane as the surface of the resin layer 6, and is exposed from the surface of the resin layer 6. In other words, a surface (exposed surface) of the external connection terminal 8 and the surface of the resin layer 6 form a single plane. This is also rephrased as the surface of the external connection terminal 8 and the surface of the resin layer 6 are at the same height.

Here, the wording "in the same plane" does not mean "exactly in the same plane". That is, the external connection terminal 8 can be substantially in the same plane as the surface of the resin layer 6, and yet the following effect is obtained.

As described above, the surface of the external connection terminal 8 is exposed from the resin layer 6, so that the external connection terminal 8 is formed on the surface of the semiconductor device 20. Thus, at the time of stacking, on the semiconductor device 20, another semiconductor device whose external connection terminal is low, the external connection terminal 8 of the semiconductor device 20 is connected with an external connection terminal of the upper semiconductor device. In other words, the resin layer 6 does not block the external connection terminal of the upper semiconductor device from reaching the external connection terminal 8, even if the height of the external connection terminal of the upper semiconductor device is lowered for the purpose of achieving a higher density integration. Since the height of the resin layer 6 does not need to be reduced for acquiring a connection between the semiconductor device 20 and the upper semiconductor device, the semiconductor device 20 of the present embodiment is high in its connection reliability, and is easily manufactured without a need for a technology to reduce the thickness of the semiconductor device 20, such a technology being a technology for reducing the thickness of the semiconductor chip 3, a technology for lowering the loop of the wire 4, or the like.

Further, in the semiconductor device 20 of the present embodiment, the wiring layer 9 formed on the surface of the semiconductor chip 3 is not exposed from the resin layer 6; i.e., the wiring layer 9 is covered with the resin layer 6. As such, the wiring layer 9 formed on the surface of the semiconductor chip 3 does not have to be covered with a mold during a resin-sealing process. This reduces damage to the semiconductor chip 3, which occurs during the resin-sealing process.

Further, it is easy to electrically connect the semiconductor device 20 of the present embodiment with the upper semiconductor device. This is because each of the external connection terminals 8 of the semiconductor device 20 is electrically connected to the base substrate 1 via the wiring layer 9.

Further, in the semiconductor device 20 of the present embodiment, the wiring layer 9 is formed on the upper surface of the semiconductor chip 3. This allows reduction of the thickness of the semiconductor device 20.

Figure 3:
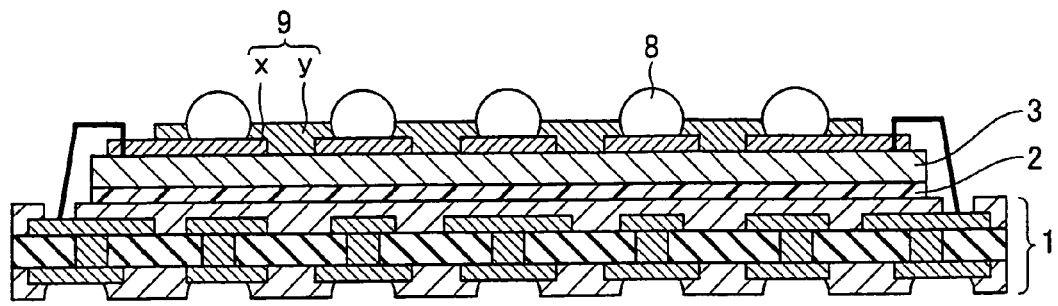
FIG. 3($a$) is a cross sectional view illustrating a semiconductor device manufacturing process of an embodiment.
Figure 3:
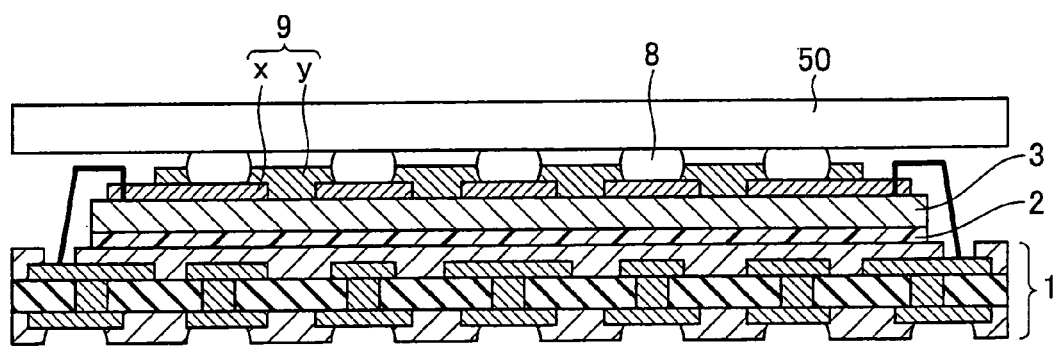
Figure 3:
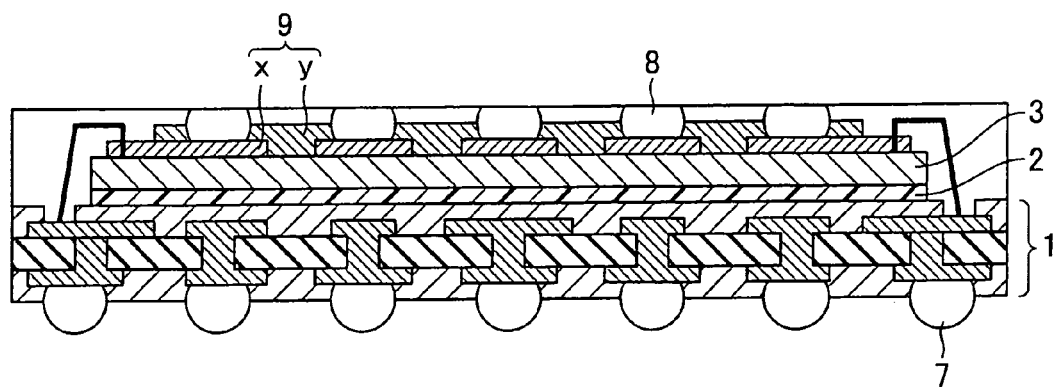

Next described is a manufacturing method for the semiconductor device 20 of the present embodiment. FIG. 3(*a*) to FIG. 3(*c*) are cross sectional views illustrating a manufacturing process of the semiconductor device of the present embodiment.

First, as illustrated in FIG. 3(*a*), a semiconductor chip 3 is mounted on an adhesive layer 2 which is provided on a base substrate 1. The semiconductor chip 3 has thereon a wiring layer 9 and external connection terminals 8 which are formed prior to the mounting of the semiconductor chip 3. Note that it is possible to mount, on the base substrate 1, the semiconductor chip 3 on which the wiring layer 9 has been formed beforehand, and then mount the external connection terminal 8. Then, the semiconductor chip 3 and wiring layer 9 are electrically connected with the base substrate 1 via the wire 4.

Next, a resin-sealing process is carried out in such a manner that the external connection terminal 8 is in the same plane as the surface of the resin layer 6, and is exposed from the surface of the resin layer 6 (sealing process). Here, a mold 50 is pressed as illustrated in FIG. 3(*b*) so as to deform the external connection terminal 8. More specifically, a surface, of the mold 50, which touches the external connection terminal 8 is flat. By pressing such a mold 50, the upper surface of the external connection terminal 8 is flattened. It is preferable that the external connection terminal 8 be made of a material which is easily deformed, so that the process is easily carried out. For example, such a material may be solder or copper.

In a case of using solder as the material of the external connection terminal 8, the solder will be melted and become flowable, if a mold temperature surpasses the melting point of the solder, at the time of carrying out the resin-sealing process. In general, the mold temperature during the resin-sealing process is between 150° C. and 200° C. On this account, it is preferable to adopt solder having a melting point of 200° C. or higher.

Then, as illustrated in FIG. 3(c), the resin-sealing process is carried out in such a manner that the external connection terminal 8 is in the same plane as the surface of the resin layer 6, and is exposed from the surface of the resin layer 6.

Lastly, an external connection terminal 7 is formed on the bottom surface of the base substrate 1. Note that the external connection terminal 7 does not necessarily have to be formed after the resin-sealing process, and it is possible to form the external connection terminal 7 prior to the resin-sealing process.

As described, the manufacturing method for the semiconductor device 20 of the present embodiment includes the resin-sealing process, and the sealing process is carried out by using the mold 50. This manufacturing method easily realizes the external connection terminal 8, of the semiconductor device 20, which terminal is (i) in the same plane as the surface of the resin layer 6, and (ii) exposed from the surface of the resin layer 6. Thus, the semiconductor device 20 is easily manufactured. According to the above explanation, the manufacturing method uses the mold 50. However, the manufacturing method is not particularly limited to the method using the mold 50, provided that the external connection terminal 8 is exposed from the resin layer 6: i.e., the external connection terminal 8 is formed on the surface of the semiconductor device 20.

The following describes alternative examples of the semiconductor device 20. Note that the same symbols are given for members having the same functions as those described hereinabove, and the explanations therefor are omitted.

Alternative Example 1

Figure 4:
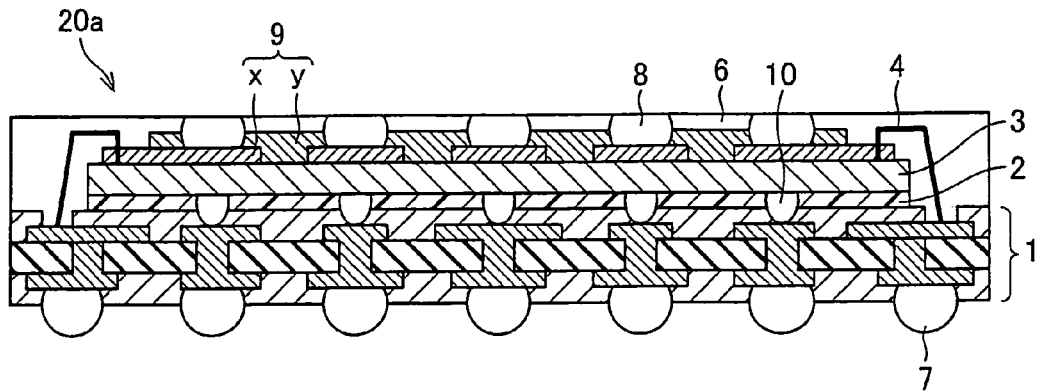
FIG. 4 is a cross sectional view illustrating a configuration of a semiconductor device of Alternative Example 1.

FIG. 4 is a cross sectional view illustrating a configuration of a semiconductor device 20a of Alternative Example 1. As illustrated in FIG. 4, a semiconductor chip 3 in the semiconductor device 20a is connected to a base substrate 1 by a flip-chip bonding using a bump 10, instead of connecting the semiconductor chip 3 and the base substrate 1 via a wire 4.

The semiconductor device 20a has the same configuration as that of the foregoing semiconductor device 20, except for the above described point.

As described, the flip-chip bonding technique is used in the semiconductor device 20a of the present alternative example, so that the semiconductor chip 3 is mounted on the base substrate 1 at a higher density.

A method for manufacturing this semiconductor device 20a is the same as the foregoing manufacturing method for the semiconductor device 20, except in that a flip-chip bonding is carried out for connecting the semiconductor chip 3 with the base substrate 1.

Alternative Example 2

Figure 5:
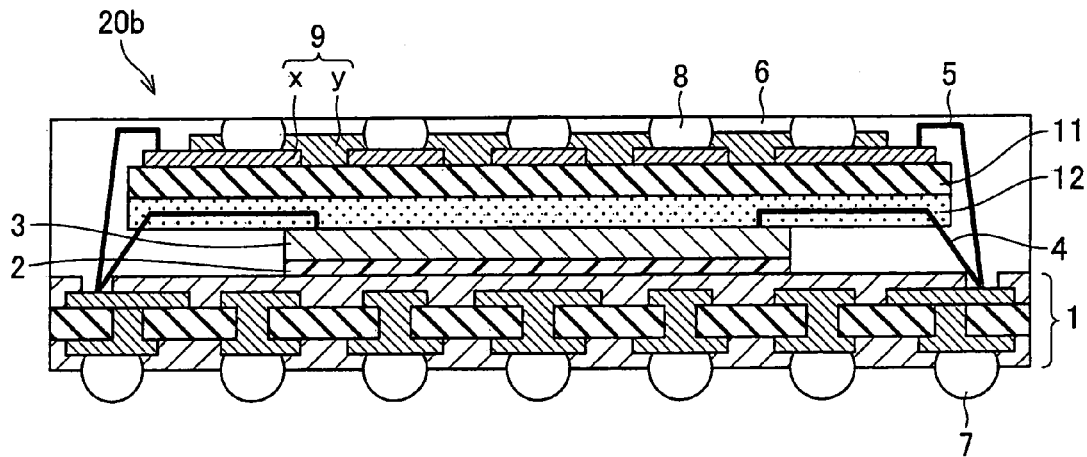
FIG. 5 is a cross sectional view illustrating a configuration of a semiconductor device of Alternative Example 2.

FIG. 5 is a cross sectional view illustrating a configuration of a semiconductor device 20b of Alternative Example 2. In the foregoing semiconductor devices 20 and 20a, the wiring layer 9 is directly formed on the semiconductor chip 3. However, in the semiconductor device 20b, a wiring layer 9 is formed on a supporting member 11. This wiring layer 9 on the supporting member 11 is mounted on an adhesive layer 12 which is provided on a semiconductor chip 3. As described, the wiring layer 9 is formed on the supporting member 11, and the wiring layer 9 on the supporting member 11 is mounted on the adhesive layer 12 on the semiconductor chip 3. With this configuration, a stress applied to the semiconductor chip is reduced by the supporting member 11 and the adhesive layer 12. Thus, damage to the semiconductor chip 3 is reduced. The supporting member 11 and the adhesive layer 12 are insulative members. By adopting, for these members, a material whose elasticity is low, the members further absorb the stress applied to the semiconductor chip 3, thus reducing the damage to the semiconductor chip 3.

Respective areas of the supporting member 11 and the wiring layer 9 formed on the supporting member 11 may be larger than the area of the semiconductor chip 3. In other words, the size of the wiring layer 9 may be larger than that of the semiconductor chip 3. By forming the wiring layer 9 through a broader region than the semiconductor chip 3, upper and lower semiconductor devices can be stacked even if the upper semiconductor device has a larger area of an external connection terminal array than the lower semiconductor chip.

The semiconductor chip 3 is connected with a base substrate 1 via a wire 4. On the other hand, the wiring layer 9 and the base substrate 1 are connected via a wire 5.

Since there is no sufficient space for providing the wire 4 between the semiconductor chip 3 and the adhesive layer 12, the wire 4 is extended through the inside of the adhesive layer 12. In other words, the wire 4 is wrapped by the adhesive layer 12. Since the wire 4 is wrapped by the adhesive layer 12, a wire deformation which occurs in the resin-sealing process is restrained.

The semiconductor device 20b has the same configuration as the foregoing semiconductor device 20, except for the above described point. Accordingly, the above described manufacturing method for the semiconductor device 20 can be used as to: (i) forming and deforming external connection terminals 8, and (ii) carrying out the resin-sealing process.

Alternative Example 3

Figure 6:
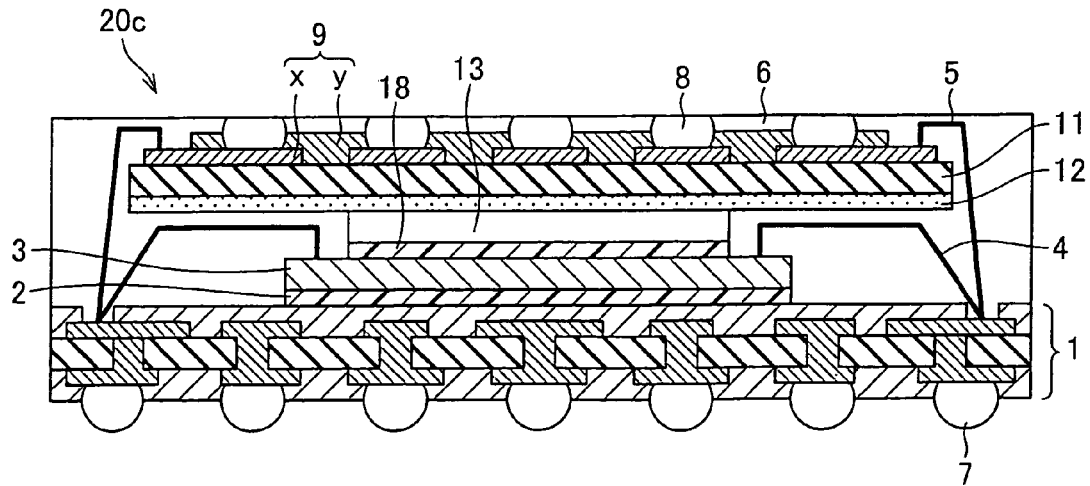
FIG. 6 is a cross sectional view illustrating a configuration of a semiconductor device of Alternative Example 3.

FIG. 6 is a cross sectional view illustrating a configuration of a semiconductor device 20c of Alternative Example 3. The configuration of the semiconductor device 20c is substantially the same as the semiconductor device 20b of Alternative Example 2. However, as illustrated in FIG. 6, the configuration of the semiconductor device 20c differs from the semiconductor device 20b in that a spacer layer 13 is provided on an adhesive layer 18 which is provided on a semiconductor chip 3.

With the provision of the spacer layer 13, a sufficient space for a wire 4 is acquired between the semiconductor chip 3 and an adhesive layer 12. Accordingly, in the semiconductor device 20c of the present alternative example, the wire 4 is not extended through the adhesive layer 12. This improves the reliability of the connection between the semiconductor chip 3 and the wire 4. Further, the supporting member 11 and the spacer layer 13 can be made of a heat conductive material. In this case, a heat dissipating characteristic is improved.

The above described manufacturing method for the semiconductor device 20 can be used for the semiconductor device 20c as to: (i) forming and deforming the external connection terminals 8, and (ii) carrying out the resin-sealing process.

Alternative Example 4

Figure 7:
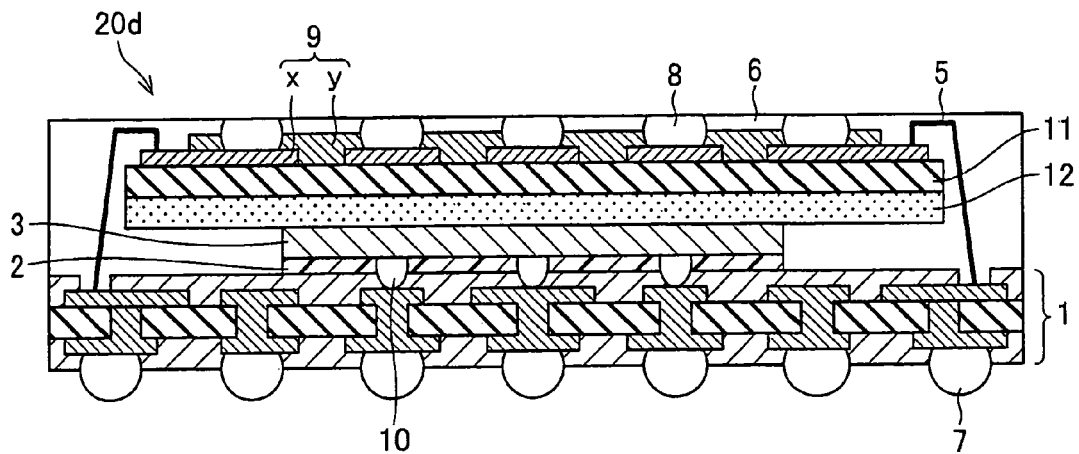
FIG. 7 is a cross sectional view illustrating a configuration of a semiconductor device of Alternative Example 4.

FIG. 7 is a cross sectional view illustrating a configuration of a semiconductor device 20d of Alternative Example 4. Unlike the semiconductor device 20b of Alternative Example 2, a semiconductor chip 3 and a base substrate 1 in the semiconductor device 20d are connected by a flip-chip boding using a bump 10, as illustrated in FIG. 7. Other than that, the configuration of the semiconductor device 20d is the same as the semiconductor 20b of Alternative Example 2.

As described, the flip-chip bonding technique is used in the semiconductor device 20d of the present alternative example, so that the semiconductor chip 3 is mounted on the base substrate 1 at a higher density. This semiconductor device 20d does not require its adhesive layer 12 to be thickened, as is the case of Alternative Example 2, nor does it require a spacer layer 13 as is required in Alternative Example 3. Thus, it is possible to reduce the thickness of the semiconductor device.

A method for manufacturing this semiconductor device 20b is the same as the foregoing manufacturing method for the semiconductor device 20, except in that a flip-chip bonding is carried out for connecting the semiconductor chip 3 with the base substrate 1.

Alternative Example 5

Figure 8:
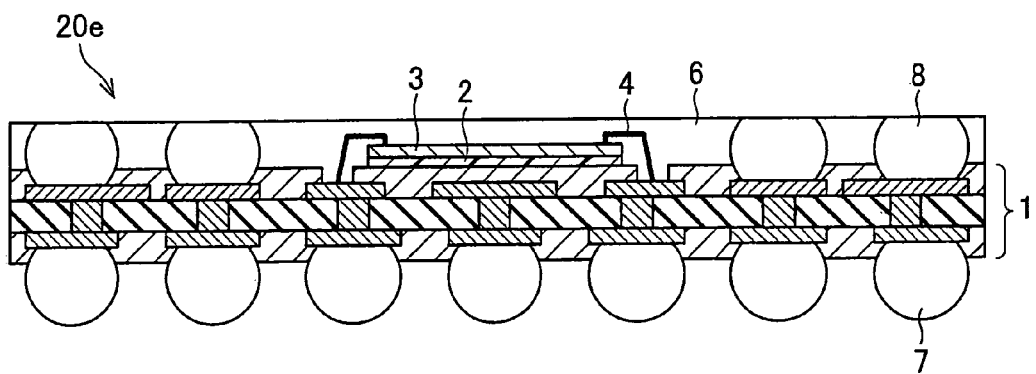
FIG. 8 is a cross sectional view illustrating a configuration of a semiconductor device of Alternative Example 5.

FIG. 8 is a cross sectional view illustrating a configuration of a semiconductor device 20e of Alternative Example 5. In the foregoing semiconductor devices 20, and 20a to 20d, the external connection terminals 8 are provided on the semiconductor chip 3 via the wiring layer 9. On the other hand, in the semiconductor device 20e, external connection terminals 8 are directly provided on a base substrate 1, and are electrically connected with the base substrate 1, as illustrated in FIG. 8.

The semiconductor device 20e has the same configuration as the semiconductor device 20, except for the above described point.

As described, in the semiconductor device 20e of the present alternative example, each of the external connection terminals 8 is formed on the base substrate 1, and not above a semiconductor chip 3. Accordingly, a stress applied to the external connection terminal 8 by a mold used in a resin-sealing process is not applied to the semiconductor chip 3. This further reduces damage to the semiconductor chip 3. Further, this is also advantageous in that the height of the semiconductor device is lowered.

The above described manufacturing method for the semiconductor device 20 can be used for the semiconductor device 20e as to: (i) forming and deforming the external connection terminals 8, and (ii) carrying out the resin-sealing process.

Alternative Example 6

Figure 9:
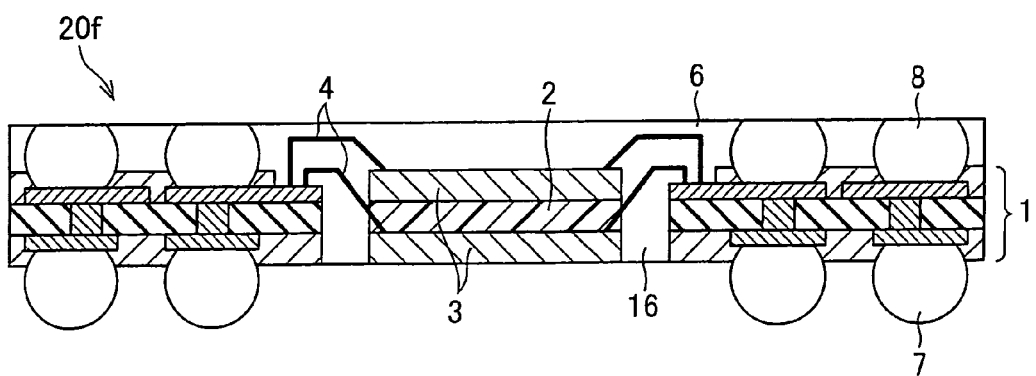
FIG. 9 is a cross sectional view illustrating a configuration of a semiconductor device of Alternative Example 6.

FIG. 9 is a cross sectional view illustrating a configuration of a semiconductor device 20f of Alternative Example 6. As in the semiconductor device 20e of Alternative Example 5, external connection terminals 8 in the semiconductor device 20f are directly provided on a base substrate 1, and are electrically connected to the base substrate 1.

As illustrated in FIG. 9, the semiconductor device 20f differs from the semiconductor device 20e, in that (1) a semiconductor chip 3 is provided in an opening portion 16 of the base substrate 1, and (2) another semiconductor chip 3 is stacked on the semiconductor chip 3, and both of the semiconductor chips 3 are electrically connected to the base substrate 1 via a wire 4 and a wiring layer 9, respectively.

The semiconductor device 20f has the same configuration as the semiconductor device 20e of Alternative Example 5, except for the above described point.

As described, the semiconductor device 20f of the present alternative example includes two semiconductor chips 3 provided in the aperture section 16 of the base substrate 1, so that the semiconductor chips 3 are mounted at a higher density than a case where the semiconductor chips 3 are provided on the base substrate 1.

Note that the present alternative example deals with a case where the number of the semiconductor chips 3 is two. However, the number of the semiconductor chips 3 being mounted is not limited to two. In a case where a single semiconductor chip 3 is mounted, it is possible to realize a thinner semiconductor device than a case of providing a semiconductor chip 3 on the base substrate 1. Accordingly, a higher density packaging is achieved in such a case as well. Further, in a case of stacking three or more semiconductor chips 3, the semiconductor chips are mounted at a higher density than a case of mounting the same number of semiconductor chips on the base substrate 1.

The above described manufacturing method for the semiconductor device 20 can be used for the semiconductor device 20f as to: (i) forming and deforming the external connection terminals 8, and (ii) carrying out the resin-sealing process.

Alternative Example 7

Figure 10:
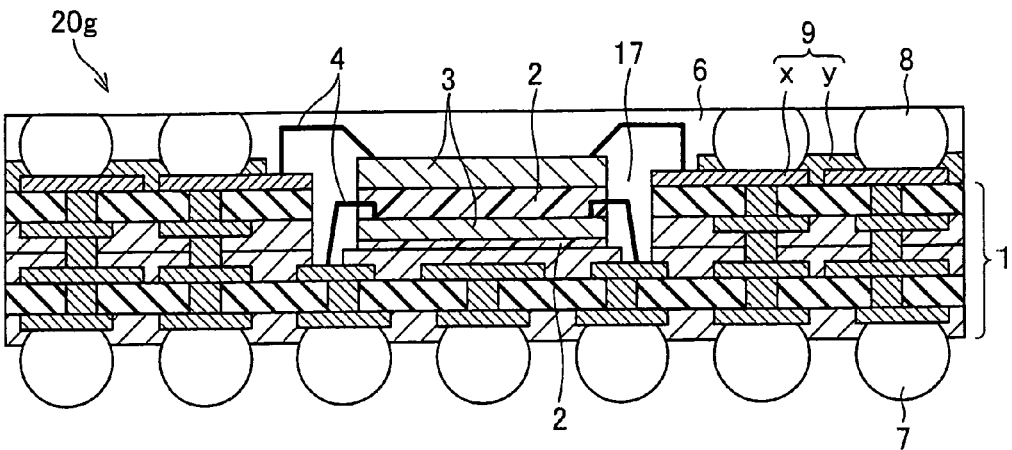
FIG. 10 is a cross sectional view illustrating a configuration of a semiconductor device of Alternative Example 7.

FIG. 10 is a cross sectional view illustrating a configuration of a semiconductor device 20g of Alternative Example 7. As in the semiconductor device 20e of Alternative Example 5, external connection terminals 8 in the semiconductor device 20g are directly provided on a base substrate 1, and are electrically connected to the base substrate 1.

As illustrated in FIG. 10, the semiconductor device 20g differs from the semiconductor device 20e, in that (1) a semiconductor chip 3 is provided in a depressed portion 17 of the base substrate 1, and (2) another semiconductor chip 3 is stacked on the semiconductor chip 3, and both of the semiconductor chips 3 are electrically connected to the base substrate 1 via a wire 4. In the present alternative example, the lower semiconductor chip 3 and the base substrate 1 are directly connected via the wire 4, and not via the wiring layer 9. However, the lower semiconductor chip 3 may be connected via the wiring layer 9. Further, the upper semiconductor chip 3 and the base substrate 1 are directly connected via the wire 4 and the wiring layer 9. However, it is not necessary to connect the upper semiconductor chip 3 via the wiring layer 9, and the upper semiconductor chip 3 may be directly connected to the base substrate 1.

The semiconductor device 20g has the same configuration as the semiconductor device 20e of Alternative Example 5, except for the above described point.

As described, the semiconductor device 20g of the present alternative example includes the semiconductor chips 3 which are provided in the depressed portion 17 of the base substrate 1. This configuration allows the semiconductor chips 3 to be mounted at a higher density than a case where the semiconductor chips 3 are provided on a portion of the base substrate 1 other than the depressed portion 17 of the base substrate 1.

Further, a provision of the depressed portion 17 on the base substrate 1 causes less deterioration in the mechanical strength of the semiconductor device, when compared with the configuration of Alternative Example 6, in which the base substrate 1 is provided with the opening portion 16.

As in Alternative Example 2, the above described manufacturing method for the semiconductor device 20 can be used for the semiconductor device 20g as to: (i) forming and deforming the external connection terminals 8, and (ii) carrying out the resin-sealing process.

Alternative Example 8

Figure 11:
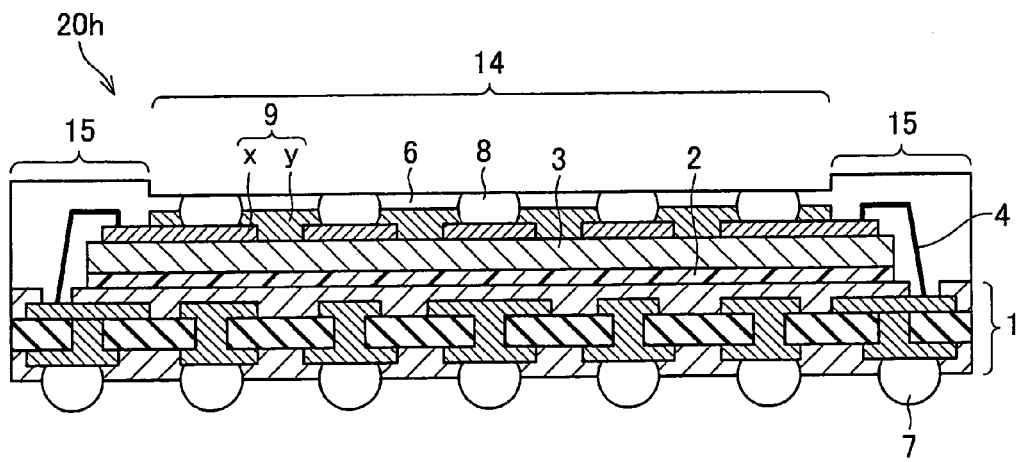
FIG. 11 is a cross sectional view illustrating a configuration of a semiconductor device of Alternative Example 8.

FIG. 11 is a cross sectional view illustrating a configuration of a semiconductor device 20h of Alternative Example 8. As illustrated in FIG. 11, the surface of a resin layer 6 of the semiconductor device 20h is not flat. The surface of the resin layer 6 in a region 14 having external connection terminals 8 is lower (i.e., depressed toward a base substrate 1) than the surface of the resin layer 6 in a region 15 which is a region other than the region 14. Other than that, the configuration of the semiconductor device 20h is the same as the semiconductor device 20.

As described, by depressing the surface of the resin layer 6 in the region having the external connection terminals 8, each external connection terminal of a semiconductor device laminated above the semiconductor device 20h is partially housed in the depressed portion. This configuration allows for an even higher density packaging.

Figure 17:
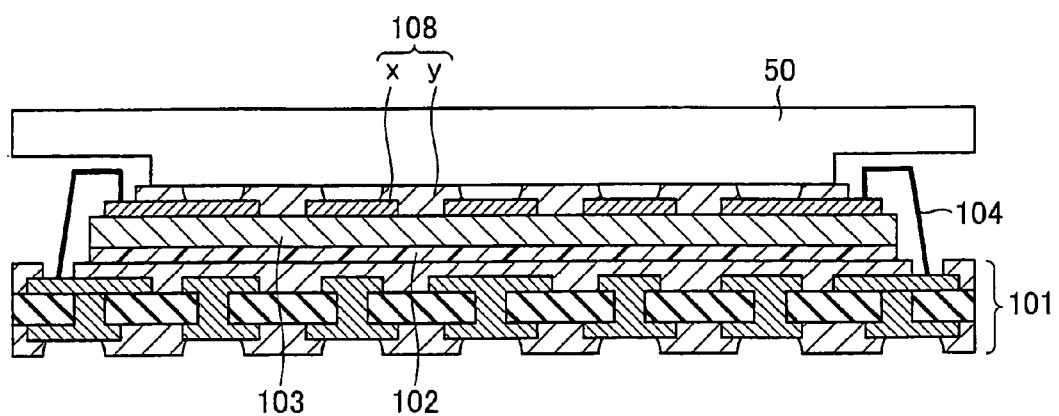
FIG. 17 is a cross sectional view illustrating a resin-sealing step carried out in a conventional manufacturing process of a semiconductor device.

As in Alternative Example 2, the above described manufacturing method for the semiconductor device 20 can be used for the semiconductor device 20h as to: (i) forming and deforming the external connection terminals 8, and (ii) carrying out the resin-sealing process. Note, however, that a mold 50 to be used is preferably a mold illustrated in FIG. 17, or the like, whose portion corresponding to the depressed portion of the surface of the resin layer 6 is projected.

Alternative Example 9

Figure 12:
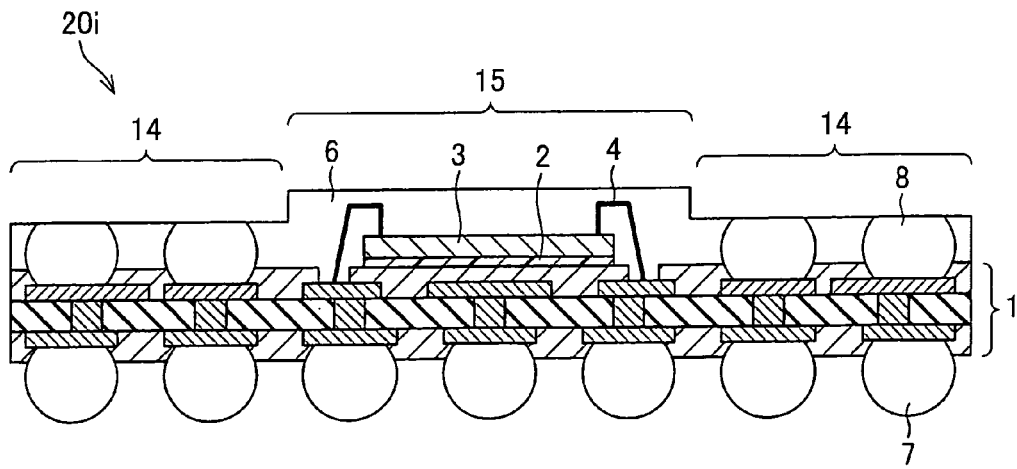
FIG. 12 is a cross sectional view illustrating a configuration of a semiconductor device of Alternative Example 9.

FIG. 12 is a cross sectional view illustrating a configuration of a semiconductor device 20i of Alternative Example 9. As illustrated in FIG. 12, in the semiconductor device 20i, the surface of a resin layer 6 in a region 14 having external connection terminals 8 is lower (i.e., depressed toward a base substrate 1) than the surface of the resin layer 6 in a region 15 which is a region other than the region 14, as in the case of the foregoing semiconductor device 20h.

Each of the external connection terminal 8 in the semiconductor device 20i is directly formed on the base substrate 1, and is electrically connected. Accordingly, in the semiconductor device 20i, a region 14 having the external connection terminals 8 is arranged on both sides of the region 15 which is a region other than the region 14, while the region 15 is arranged on both sides of the region 14 having the external connection terminals 8, in the semiconductor device 20h.

The configuration of the semiconductor device 20i is the same as the semiconductor device 20h of Alternative Example 8, other than the above described point.

As described, each of the external connection terminal 8 is formed on the base substrate 1, and not above the semiconductor chip 3. With this configuration, the stress applied to the external connection terminal 8 by the mold used in the resin-sealing process is prevented from being applied to the semiconductor chip 3. Thus, damage to the semiconductor chip 3 is further reduced.

Further, by depressing the surface of the resin layer 6 in the region having the external connection terminals 8, each external connection terminal of a semiconductor device laminated above the semiconductor device 20i is partially housed in the depressed portion. This configuration allows for an even higher density packaging.

As in Alternative Example 2, the above described manufacturing method for the semiconductor device 20 can be used for the semiconductor device 20i as to: (i) forming and deforming the external connection terminals 8, and (ii) carrying out the resin-sealing process. Note, however, that a mold 50 to be used is preferably a mold illustrated in FIG. 17 or the like whose portion corresponding to the depressed portion of the surface of the resin layer 6 is projected.

Alternative Example 10

Figure 13:
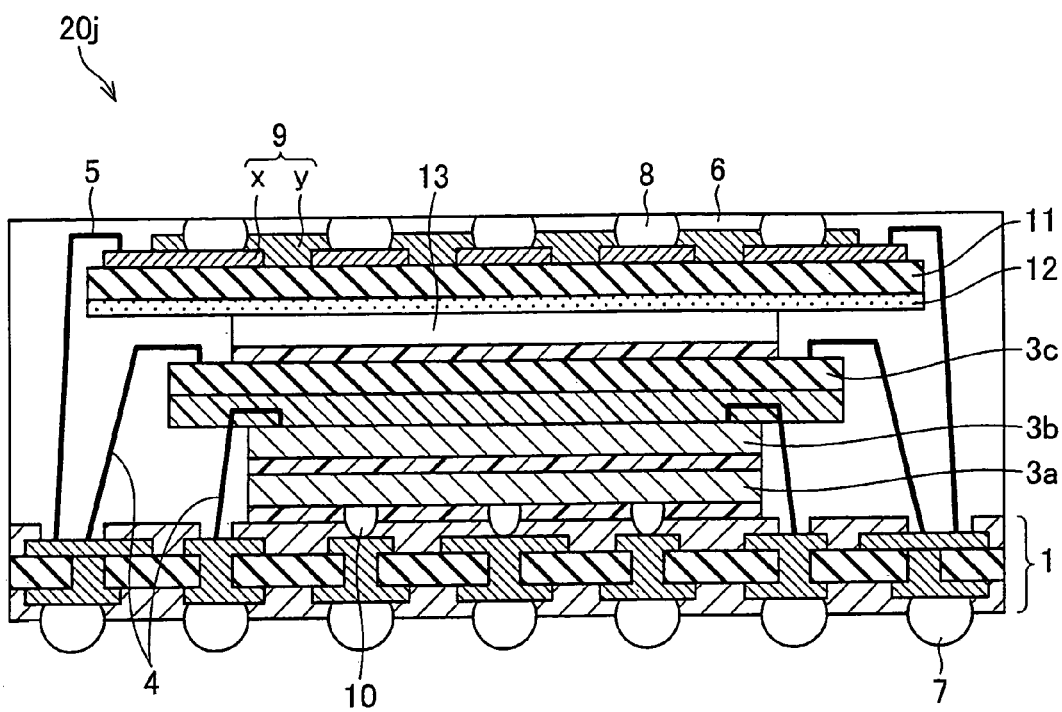
FIG. 13 is a cross sectional view illustrating a configuration of a semiconductor device of Alternative Example 10.

FIG. 13 is a cross sectional view illustrating a configuration of a semiconductor device 20j of Alternative Example 10. As illustrated in FIG. 13, the semiconductor device 20j includes: a base substrate 1; three semiconductor chips 3a to 3c which are stacked on the base substrate 1; and external connection terminals (second external connection terminals) 7 provided on the bottom surface of the base substrate 1.

An adhesive layer is provided on the base substrate 1, and the lower semiconductor chip 3a is provided on the adhesive layer on the base substrate 1. This semiconductor device 3a is electrically connected with the base substrate 1 by a flip-chip bonding using a bump 10.

Further, an adhesive layer is formed on the lower semiconductor chip 3a, and the middle semiconductor chip 3b is provided on the adhesive layer on the lower semiconductor chip 3a. This semiconductor chip 3b is electrically connected with the base substrate 1 via a wire 4. The wire 4 connecting the middle semiconductor chip 3b with the base substrate 1 is extended through the inside of an adhesive layer provided on the middle semiconductor chip 3b.

The upper semiconductor chip 3c is provided on the adhesive layer which is provided on the middle semiconductor chip 3b. This upper semiconductor chip 3c is electrically connected to the base substrate 1 via a wire 4. On this upper semiconductor chip 3c, an adhesive layer is provided, and a spacer layer 13 is provided on the adhesive layer on the semiconductor chip 3c. Therefore, the wire 4 which connects the upper semiconductor chip 3c with the base substrate 1 is not extended through the inside of the adhesive layer.

The spacer layer 13 has thereon an adhesive layer, and a supporting member 11 is provided on the adhesive layer on the spacer layer 13. Further, the supporting member 11 has thereon a wiring layer 9, and an external connection terminals (first external connection terminals) 8 which are electrically conductive projections formed on the wiring layer 9. As is the case of the configuration of FIG. 2, these external communication terminals 8 are arranged in an area-array manner. The wiring layer 9 and the base substrate 1 are connected via a wire 5.

Further, the semiconductor device 20j is sealed by a resin layer 6. More specifically, the resin layer 6 entirely covers the members formed on the upper surface of the base substrate 1, except for the external connection terminals 8.

As in the foregoing semiconductor device 20, each of the external connection terminals 8 in the semiconductor device 20j is in the same plane as the surface of the resin layer 6, and is exposed from the surface of the resin layer 6. In other words, the surface of the external connection terminal 8 and the surface of the resin layer 6 form a single surface. This is also rephrased as the surface of the external connection terminal 8 and the surface of the resin layer 6 are at the same height. Here, the description reading "in the same plane as the surface of the resin layer 6" does not mean that the surface of the external connection terminal 8 has to be exactly in the same plane as the surface of the resin layer 6, and the surface of the external connection terminal 8 may be substantially in the same plane as the surface of the resin layer 6.

As described, three semiconductor chips 3a to 3c are mounted in the semiconductor device 20j of the present alternative example. Thus, it is possible to achieve an even higher density packaging.

Note that the present alternative example deals with a case where three semiconductor chips 3 are stacked, however, the number of the semiconductor chips 3 is not limited to three. It is possible to stack two semiconductor chips 3, or stack four or more semiconductor chips 3. Further, how the semiconductor chips 3 are mounted is not particularly limited.

As in Alternative Example 2, the above described manufacturing method for the semiconductor device 20 can be used for the semiconductor device 20*j* as to: (i) forming and deforming the external connection terminals 8, and (ii) carrying out the resin-sealing process.

Figure 14:
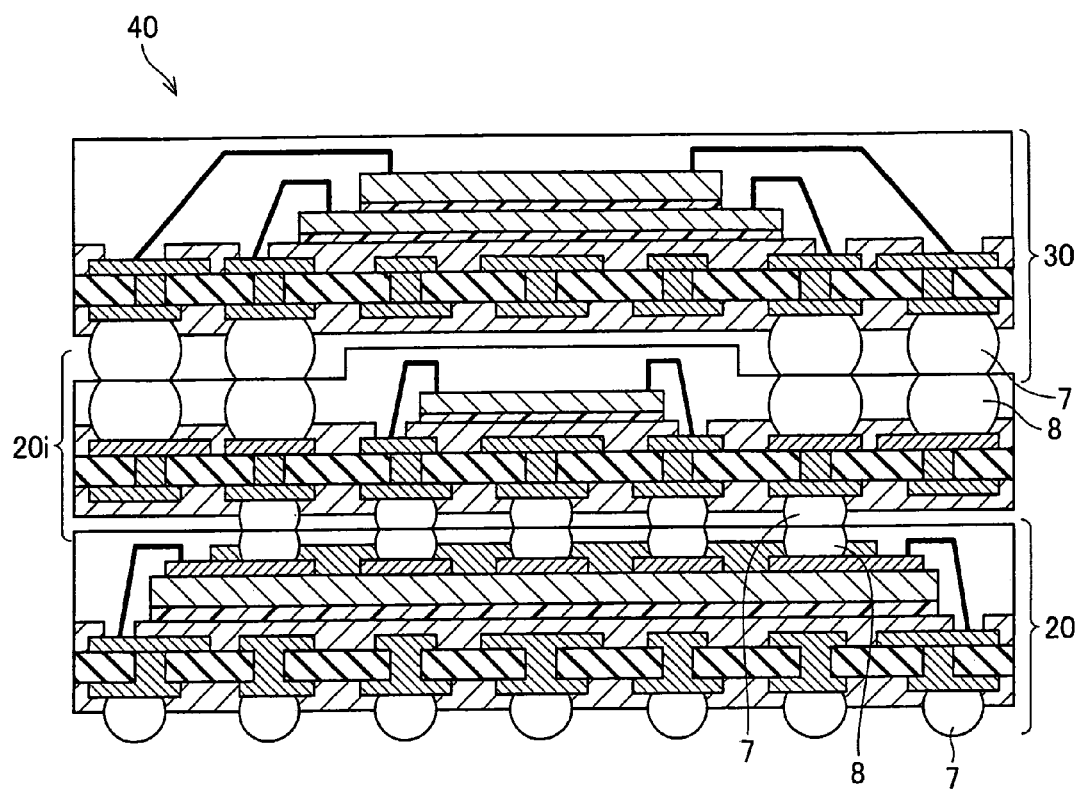
FIG. 14 is a cross sectional view illustrating a configuration of a stacked semiconductor device.
Figure 15:
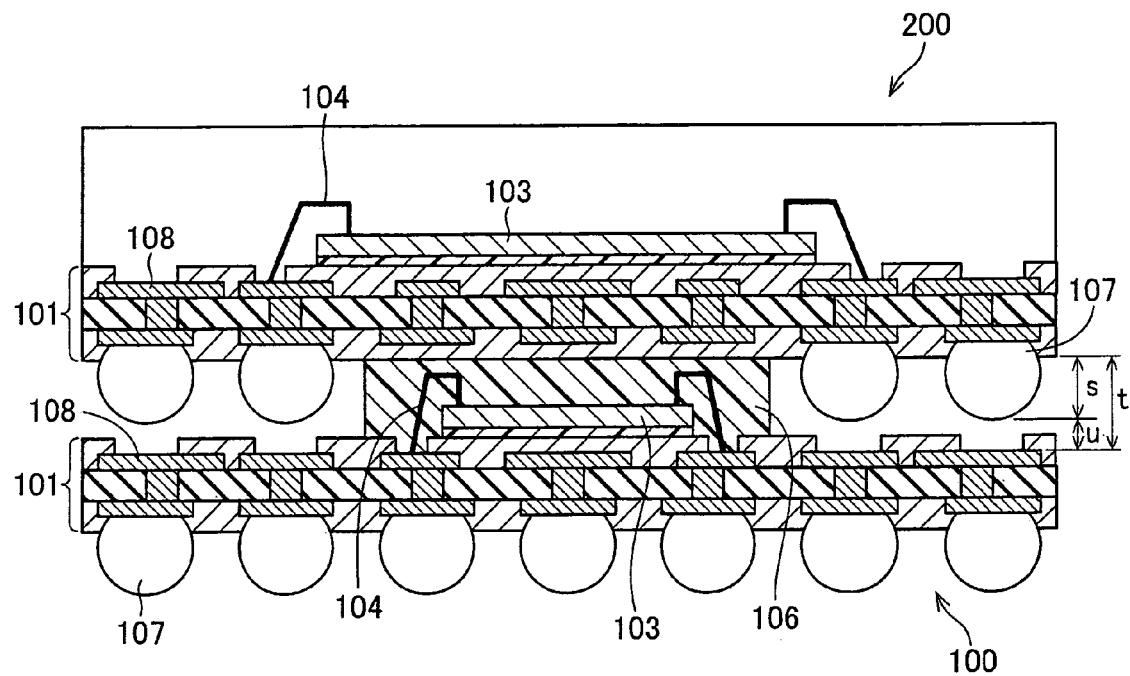
FIG. 15 is a cross sectional view illustrating a stack of two conventional semiconductor devices.
Figure 16:
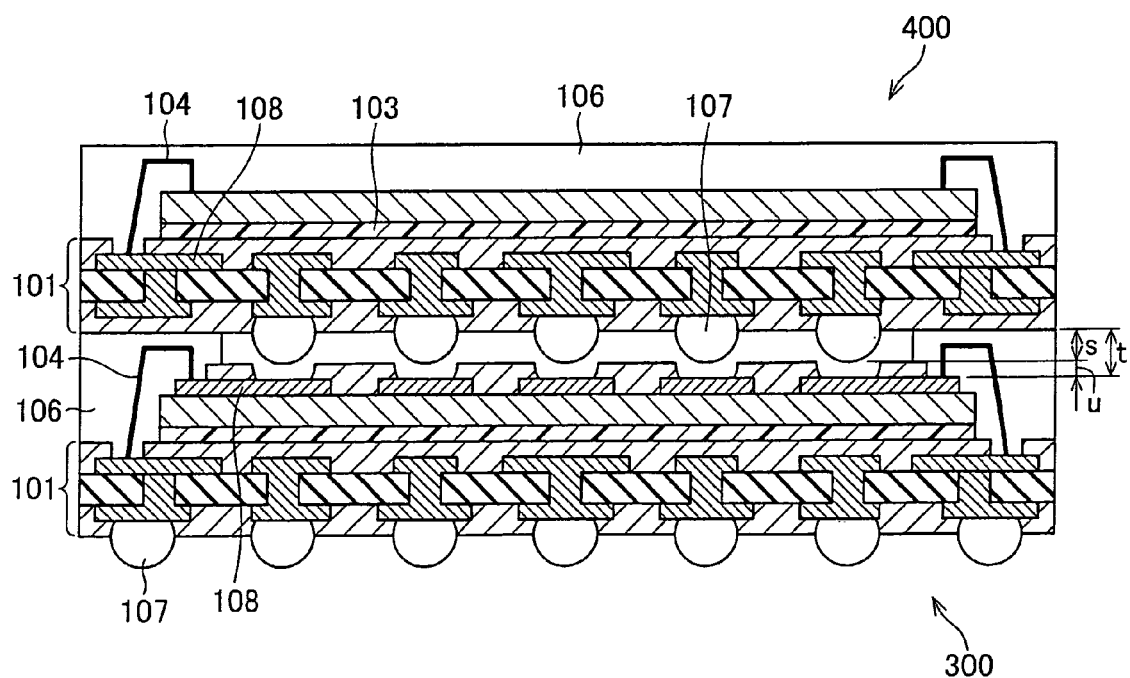
FIG. 16 is a cross sectional view illustrating a stack of two conventional semiconductor devices.

Next described is a stacked semiconductor device. FIG. 14 is a cross sectional view illustrating the configuration of a stacked semiconductor device 40.

As illustrated in FIG. 14, the foregoing semiconductor 20*i* is stacked on the foregoing semiconductor device 20, and another semiconductor device 30 is stacked on the semiconductor 20*i*.

The external connection terminals 8 of the semiconductor device 20 are respectively jointed to the external connection terminals 7 of the semiconductor device 20*i*, so that the semiconductor devices 20 and 20*i* are electrically connected with each other.

The semiconductor device 30 has on its bottom surface external connection terminals 7. The external connection terminals 8 of the semiconductor device 20*i* are respectively jointed to the external connection terminals 7 of the semiconductor device 30, so that the semiconductor devices 20*i* and 30 are electrically connected with each other.

As described, the external connection terminals 8 of the semiconductor device 20 are in the same plane as the surface of the resin layer 6, and are exposed from the surface of the resin layer 6. Accordingly, even if the respective heights of the external connection terminals 7 of the semiconductor device 20*i* is low, the external connection terminals 8 of the semiconductor device 20 and the external connection terminal 7 of the semiconductor device 20*i* are respectively connected with each other. Similarly, the external connection terminals 8 of the semiconductor device 20*i* are also in the same plane as the surface of the resin layer 6, and are exposed from the surface of the resin layer 6. Accordingly, even if the respective heights of the external connection terminals 7 of the semiconductor device 30 are low, the external connection terminals 8 of the semiconductor device 20*i* and the external connection terminals 7 of the semiconductor device 30 are respectively connected with each other.

As described above, the semiconductor device 40 is formed by stacking the semiconductor devices 20, 20*i*, and 30, and electrically connecting them with one another. This configuration allows lowering of the external connection terminals 7 while avoiding deterioration in the connection stability. As a result, a high density packaging of semiconductor devices is possible.

Note that the above explanation deals with a case where the number of semiconductor devices to be stacked is three. However, the number of the semiconductor devices to be stacked is not limited to this, and it is possible to stack two semiconductor devices, or stack four or more semiconductor devices.

Further, the above explanation deals with a case where the semiconductor devices 20, 20*i*, and 30 are stacked. However, the semiconductor device 30 can be stacked on any one of or more than one of the semiconductor devices 20, and 20*a* to 20*j*. Alternatively, it is possible to stack a plurality of semiconductor devices selected from the semiconductor devices 20, and 20*a* to 20*j*.

It will be obvious that the above-described devices and methods may be varied in many ways. Such variations are not to be regarded as a departure from the spirit and scope of the disclosure, and all such modifications as would be obvious to one skilled in the art are intended to be included within the scope of the following claims.

As described, a semiconductor device includes: a base substrate; a semiconductor chip electrically connected to the base substrate; a resin layer covering at least a portion of the semiconductor chip; and a first external connection terminal electrically connected to the base substrate, wherein the first external connection terminal has an exposed surface which is exposed from a surface of the resin layer, and the exposed surface of the first external connection terminal and the surface of the resin layer form a single plane.

In the configuration, the first external connection terminal has the exposed surface which is exposed from the surface of the resin layer, and the exposed surface of the first external connection terminal and the surface of the resin layer form a single plane. Therefore, at a time of stacking another semiconductor device on the semiconductor device as disclosed, the first external connection terminal is connected with an external connection terminal of the upper semiconductor device, even if the external connection terminal of the upper semiconductor device is low. Incidentally, in a case where external connection terminals of the upper semiconductor device are arranged at a narrow pitch, the height of each of the external connection terminals is low. However, with the configuration, the resin layer does not block the external connection terminal from reaching the first external connection terminal. Thus, it is not necessary to lower the resin layer for the purpose of acquiring a connection between the external connection terminals. As a result, the semiconductor device is high in its connection reliability, and is easily manufactured without a need for a technology to reduce the thickness of the semiconductor device, such a technology being a technology for reducing the thickness of the semiconductor chip, a technology for lowering the loop of the wire, or the like.

Further, instead of exposing the wiring layer formed on the semiconductor chip, the above described first external connection terminal is used for acquiring the connection with the upper semiconductor device. This reduces damage to the semiconductor chip even if the semiconductor device is sealed with a resin by using a transfer mold or the like.

The semiconductor device may be adapted so that said first external connection terminal is electrically connected with the base substrate via a wiring layer.

By electrically connecting the first external connection terminal with the base substrate via the wiring layer as described above, an electrical connection between the semiconductor device of the present technology and the upper semiconductor device is easily acquired.

The semiconductor device may be adapted so that said wiring layer is formed on a surface, of the semiconductor chip, on a side of the external connection terminal.

In the configuration, the wiring layer is formed on the surface, of the semiconductor chip, on the side of the first external connection terminal. This is more advantageous in terms of reducing the thickness of a semiconductor device, when compared to a later described case where supporting member and/or an adhesive layer is/are interposed.

The semiconductor device may be adapted so that said wiring layer is formed on a supporting member, and is mounted on the semiconductor chip.

By forming the wiring layer on the supporting member, and by mounting the wiring layer on an adhesive layer on the semiconductor chip, a stress to be applied to the semiconductor chip is reduced by the supporting member and the adhesive layer. Thus, damage to the semiconductor chip is further reduced.

The semiconductor device may be adapted so that an area of a region in which the wiring layer is provided is larger than an area of the semiconductor chip. In short, the wiring layer may be larger than the semiconductor chip.

As described, by forming the wiring layer through a broader region than the semiconductor chip, the upper and lower semiconductor devices can be stacked even if the upper semiconductor device has a larger area of an external connection terminal array than the lower semiconductor chip.

The semiconductor device may be adapted so that said first external connection terminal is formed on the base substrate.

As described, the first external connection terminal is formed on the base substrate, and not above the semiconductor chip. With this configuration, the stress applied to the first external connection terminal by the mold used in a resin-sealing process is prevented from being applied to the semiconductor chip. Thus, damage to the semiconductor chip is further reduced. Further, this is also advantageous in that the height of the semiconductor device is lowered.

The semiconductor device may be adapted so that said semiconductor chip is provided in an aperture section of the base substrate.

By providing the semiconductor chip in the aperture section of the base substrate, it is possible to package semiconductor chips at a higher density than a case where the semiconductor chip is provided on the base substrate.

The semiconductor device may be adapted so that said semiconductor chip is provided in a depressed portion of the base substrate.

By providing the semiconductor chip in the depressed portion of the base substrate, it is possible to package semiconductor chips at a higher density than a case where the semiconductor chip is provided on the base substrate.

The semiconductor device may be adapted so that a first surface of the resin layer is depressed towards the base substrate so that the first surface is closer to the base substrate than a second surface of the resin layer is to the base substrate, the first surface being a surface of the resin layer in a region where the first external connection terminal is provided, and the second surface being a surface of the resin layer other than the first surface. In other words, the resin surface (first surface) of the region in which the first external connection terminal is provided may be lower than the resin surface (second surface) of the other region.

As described, by depressing the surface of the resin layer in the region having the first external connection terminal, the external connection terminal of a semiconductor device stacked above the semiconductor device of the present technology is partially housed in the depressed portion. This configuration allows for an even higher density packaging.

The semiconductor device may be adapted so that said first external connection terminal is made of a solder.

By using, as a material of the first external connection terminal, a solder which is easily deformable, the first external connection terminal is easily deformed. Further, it becomes easy to expose, from the resin layer, the exposed surface of the first external connection terminal, and form a single plane including the exposed surface and the surface of the resin layer.

The semiconductor device may be adapted so that said solder has a melting point of 200° C. or higher.

The mold temperature during the resin-sealing process, in general, is between 150° C. to 200° C. Accordingly, if the solder has the melting point of 200° C. or higher, it is possible to reduce the risk that the mold temperature surpasses the melting point of solder, and that the solder is melted and becomes flowable.

The semiconductor device may be adapted so that said first external connection terminal is made of copper.

By using, as a material of the first external connection terminal, copper which is easily deformable, the first external connection terminal is easily deformed. Further, it becomes easy to expose, from the resin layer, the exposed surface of the first external connection terminal, and form a single plane including the exposed surface and the surface of the resin layer.

Further, a semiconductor may include: a base substrate; a plurality of semiconductor chips each electrically connected to the base substrate; a resin layer covering at least a portion of the semiconductor chip; and a first external connection terminal electrically connected to the base substrate, wherein the first external connection terminal has an exposed surface which is exposed from a surface of the resin layer, and the exposed surface of the first external connection terminal and the surface of the resin layer form a single plane.

It is possible to achieve a higher density packaging, by mounting a plurality of the semiconductor chips within the resin layer.

Further, as described, a stacked semiconductor device includes: any one of the above described semiconductor devices, and another one of the above described semiconductor devices further including a second external connection terminal, wherein the above semiconductor device is electrically connected with the another one of the above semiconductor devices, by jointing the first external connection terminal of the above semiconductor device with the second external connection terminal of the another one of the above semiconductor devices.

In the configuration, the semiconductor devices are electrically connected with each other by jointing the first external connection terminal to the second external connection terminal. This configuration allows for even higher density packaging.

Further, as described, a stacked semiconductor device includes: any one of the above described semiconductor devices, and another semiconductor device further including a second external connection terminal, wherein the above semiconductor device is electrically connected with the another semiconductor device, by jointing the first external connection terminal of the above semiconductor device with the second external connection terminal of the another semiconductor device.

In the configuration, the semiconductor devices are electrically connected with each other by jointing the first external connection terminal to the second external connection terminal. This configuration allows for even higher density packaging.

Further a method for manufacturing a semiconductor device is a method for manufacturing a semiconductor device including (i) a base substrate, (ii) a semiconductor chip electrically connected to the base substrate, (iii) a resin layer covering at least a portion of the semiconductor chip, and (iv) a first external connection terminal electrically connected to the base substrate, the method comprising the step of: (A) sealing with a resin such that (a) the first external connection terminal has an exposed surface which is exposed from a surface of the resin layer, and (b) the exposed surface of the first external connection terminal and the surface of the resin layer form a single plane.

With the configuration, it is possible to manufacture a semiconductor device in which (i) a first external connection terminal having the exposed surface which is exposed from a surface of the resin layer, and (ii) the exposed surface and the surface of the resin layer form a single plane. Thus, at a time of stacking another semiconductor device on the semiconductor device, the semiconductor devices are connected with each other, even if an external connection terminal of the upper semiconductor device is low. Incidentally, in a case where external connection terminals of the upper semiconductor device are arranged at a narrow pitch, the height of each of the external connection terminals is low. However, with the configuration, the resin layer does not block the external connection terminal from reaching the first external connection terminal. Thus, it is not necessary to lower the resin layer for the purpose of acquiring a connection with the upper semiconductor device. As a result, the method allows easy manufacturing of a semiconductor device which is high in its connection reliability, and the method does not require a technology to reduce the thickness of the semiconductor device, such a technology being a technology for reducing the thickness of the semiconductor chip, a technology for lowering the loop of the wire, or the like.

Further, damage to the semiconductor chip is reduced by (i) forming and deforming the external connection terminal, and then (ii) carrying out the resin-sealing process, instead of exposing the wiring layer formed on the surface of the semiconductor chip for the purpose of acquiring the connection with the upper semiconductor device.

Further, the method may be adapted so that the step (A) includes the sub steps of: pressing a mold against the first external connection terminal to flatten a surface of the first external connection terminal; and sealing with the resin such that (a) the first external connection terminal has the exposed surface which is exposed from the surface of the resin layer, and (b) the exposed surface of the first external connection terminal and the surface of the resin layer form a single plane.

In the configuration, the sub step of sealing is carried out after the external connection terminal is deformed by pressing the mold against the external connection terminal. With this simple process, it is possible to expose, from the resin layer, the exposed surface of the external connection terminal, and to form a single plane including the exposed surface and the surface of the resin layer. Thus, a semiconductor device is easily manufactured.

Further, the method may further include the step of heating the mold to a temperature of not more than a melting point of the first external connection terminal.

By heating the mold to a temperature which is not more than the melting point of the external connection terminal, it is possible to reduce the risk that the mold temperature surpasses the melting point of solder, and that the solder is melted and becomes flowable.

In the semiconductor device, the first external connection terminal has the exposed surface, and the exposed surface of the first connection terminal and the resin layer form a single plane. Therefore, at a time of stacking another semiconductor device on the semiconductor device of the present technology, the first external connection terminal is connected with an external connection terminal of the upper semiconductor device, even if the external connection terminal of the upper semiconductor device is low. Thus, it is not necessary to lower the resin layer for the purpose of acquiring a connection between the external connection terminals. As a result, the semiconductor device of the present invention is high in its connection reliability, and is easily manufactured without a need for a technology to reduce the thickness of the semiconductor device, such a technology being a technology for reducing the thickness of the semiconductor chip, a technology for lowering the loop of the wire, or the like.

Further, instead of exposing the wiring layer formed on the semiconductor chip, the above described first external connection terminal is used for acquiring the connection with the upper semiconductor device. This reduces damage to the semiconductor chip even if the semiconductor device is sealed with a resin by using a transfer mold or the like.

The embodiments and concrete examples of implementation discussed in the foregoing detailed explanation serve solely to illustrate the technical details of the present technology, which should not be narrowly interpreted within the limits of such embodiments and concrete examples, but rather may be applied in many variations within the spirit of the present technology, provided such variations do not exceed the scope of the patent claims set forth below.

What is claimed is:

1. A semiconductor device, comprising:
   a base substrate;
   a semiconductor chip electrically coupled to the base substrate;
   a supporting member attached to the semiconductor chip, wherein a wiring layer is formed on a surface of the supporting member opposite the semiconductor chip;
   a resin layer covering at least portions of the semiconductor chip and the supporting member; and
   a plurality of external connection terminals that are electrically coupled to the wiring layer, wherein surfaces of the external connection terminals are exposed from the resin layer, and wherein the exposed surfaces of the external connection terminals are substantially co-planer with an exterior surface of the resin layer.

2. The semiconductor device as set forth in claim 1, wherein bonding wires electrically couple the wiring layer to the base substrate.

3. The semiconductor device as set forth in claim 1, wherein:
   a first surface of the resin layer is depressed towards the base substrate so that the first surface is closer to the base substrate than a second surface of the resin layer is to the base substrate,
   the first surface being a surface of the resin layer in a region where the external connection terminals are provided, and
   the second surface being a surface of the resin layer other than the first surface.

4. The semiconductor device as set forth in claim 1, wherein said external connection terminals are made of a solder.

5. The semiconductor device as set forth in claim 1, wherein said external connection terminals are made of copper.

6. The semiconductor device as set forth in claim 2, wherein the bonding wires are encapsulated in the resin layer.

7. The semiconductor device as set forth in claim 2, wherein a plurality of solder bumps electrically couple the semiconductor chip to the base substrate.

8. The semiconductor device as set forth in claim 2, wherein bonding wires also electrically couple the semiconductor chip to the base substrate.

9. The semiconductor device as set forth in claim 4, wherein said solder has a melting point of 200° C. or higher.

10. The semiconductor device as set forth in claim 8, further comprising an adhesive layer that couples the supporting member to the semiconductor chip, wherein the bonding wires that electrically couple the semiconductor chip to the base substrate pass through the adhesive layer.

11. The semiconductor device as set forth in claim 8, further comprising a spacer position between the semiconductor chip and the supporting member, wherein the spacer provides sufficient space between the semiconductor chip and the supporting member to allow the bonding wires to pass, unobstructed, between the semiconductor chip and the base substrate.

* * * * *